US010952336B2

(12) United States Patent
Bernhardt et al.

(10) Patent No.: US 10,952,336 B2
(45) Date of Patent: Mar. 16, 2021

(54) HOUSING FOR ACCOMMODATING A SINGLE- OR MULTI-PART PRINTED CIRCUIT BOARD

(71) Applicant: CONTINENTAL AUTOMOTIVE GMBH, Hannover (DE)

(72) Inventors: Andreas Bernhardt, Wenzenbach (DE); Manuel Fernando Lopera Diaz, Pereira (CO)

(73) Assignee: Continental Automotive GmbH, Hannover (DE)

( * ) Notice: Subject to any disclaimer, the term of this patent is extended or adjusted under 35 U.S.C. 154(b) by 71 days.

(21) Appl. No.: 16/341,253

(22) PCT Filed: Oct. 10, 2017

(86) PCT No.: PCT/EP2017/075845
§ 371 (c)(1),
(2) Date: Apr. 11, 2019

(87) PCT Pub. No.: WO2018/069340
PCT Pub. Date: Apr. 19, 2018

(65) Prior Publication Data
US 2020/0045837 A1 Feb. 6, 2020

(30) Foreign Application Priority Data
Oct. 11, 2016 (DE) .......................... 102016219662.6

(51) Int. Cl.
*H05K 5/00* (2006.01)
*H05K 1/02* (2006.01)
*H05K 5/02* (2006.01)

(52) U.S. Cl.
CPC ......... *H05K 5/0039* (2013.01); *H05K 1/0278* (2013.01); *H05K 5/0217* (2013.01)

(58) Field of Classification Search
CPC ...... H05K 5/0039; H05K 1/181; H05K 1/028; H05K 2201/10151; H05K 1/0271;
(Continued)

(56) References Cited

U.S. PATENT DOCUMENTS 5,999,416 A * 12/1999 McAnally ............ H05K 9/0049
174/372
6,134,121 A * 10/2000 Braxton .............. H04M 1/0277
361/818
(Continued)

FOREIGN PATENT DOCUMENTS

CN  1905788 A  1/2007
CN  201440770 U  4/2010
(Continued)

*Primary Examiner* — Jenny L Wagner
*Assistant Examiner* — Krystal Robinson
(74) *Attorney, Agent, or Firm* — Laurence A. Greenberg; Werner H. Stemer; Ralph E. Locher

(57) ABSTRACT

A housing for accommodating a single or multi-part printed circuit board includes an opening in a first housing side for inserting the printed circuit board, at least one guide rail having a groove for receiving the printed circuit board and being situated on at least one first housing side wall of a group of housing side walls running perpendicularly to the first housing side. The guide rail is configured to receive a peg disposed on one of the printed circuit board parts. The guide rail runs from the first housing side towards a second housing side opposite the first housing side, so that the end of the guide rail near the first housing side is further away than the other end of the guide rail from the housing side wall which is oriented perpendicularly to the first housing side wall and is closest to the guide rail.

6 Claims, 5 Drawing Sheets

(58) Field of Classification Search
CPC ........ H05K 1/0281; H05K 1/09; H05K 1/111;
H05K 1/113; H05K 1/115; H05K 1/147;
H05K 1/18; H05K 2201/09409; H05K
2201/09727; H05K 2201/10128; H05K
2201/10136; H05K 2203/072; H05K
3/24; H05K 3/303; H05K 3/32; H05K
3/4644; H05K 3/4652; H05K 3/4682;
H05K 3/4697; H05K 5/0017; H05K
7/1427; H05K 7/205; H05K 13/0812;
H05K 13/0813; H05K 1/0204; H05K
1/0206; H05K 1/0209; H05K 1/0228;
H05K 1/024; H05K 1/0242; H05K
1/0243; H05K 1/0245; H05K 1/0278;
H05K 1/0296; H05K 1/117; H05K 1/118;
H05K 1/14; H05K 1/141; H05K 1/144;
H05K 1/165; H05K 1/185; H05K 1/189;
H05K 2201/0191; H05K 2201/0215;
H05K 2201/0326; H05K 2201/0338;
H05K 2201/041; H05K 2201/046; H05K
2201/048; H05K 2201/051; H05K
2201/056; H05K 2201/066; H05K
2201/086; H05K 2201/09018; H05K
2201/09063; H05K 2201/09227; H05K
2201/09272; H05K 2201/095; H05K
2201/09609; H05K 2201/09709; G06F
1/1656
USPC .......................................................... 174/500
See application file for complete search history.

(56) References Cited

U.S. PATENT DOCUMENTS

| 7,413,463 | B2 | 8/2008 | Matsuo |
| 7,894,185 | B2* | 2/2011 | Weber ................... G06F 1/1656 361/679.56 |
| 10,383,253 | B1* | 8/2019 | Mujcinovic ............ H05K 5/069 |
| 2005/0078461 | A1 | 4/2005 | Dobbs et al. |
| 2007/0020981 | A1* | 1/2007 | Matsuo ................. H05K 5/0039 439/264 |
| 2012/0276759 | A1* | 11/2012 | Tanaka ................. H05K 5/0039 439/76.1 |
| 2013/0021754 | A1* | 1/2013 | Lu ......................... H05K 1/0203 361/714 |
| 2016/0095235 | A1 | 3/2016 | Yang et al. |
| 2017/0163013 | A1* | 6/2017 | Imaizumi .............. H05K 5/0069 |
| 2019/0297737 | A1* | 9/2019 | Kawamura .......... B60R 16/0239 |
| 2020/0047695 | A1* | 2/2020 | Mori ..................... H05K 5/0017 |
| 2020/0053898 | A1* | 2/2020 | Matsumura .......... H05K 7/1405 |
| 2020/0120816 | A1* | 4/2020 | Imaizumi ............... H05K 7/026 |

FOREIGN PATENT DOCUMENTS

| CN | 103379776 | A | * | 10/2013 | .......... H05K 7/1418 |
| CN | 103379776 | A | | 10/2013 | |
| CN | 105751990 | A | | 7/2016 | |
| DE | 102004005330 | A1 | | 8/2005 | |
| DE | 102012206980 | A1 | | 10/2013 | |
| WO | 2005075253 | A1 | | 8/2005 | |
| WO | 2007090741 | A1 | | 8/2007 | |

* cited by examiner

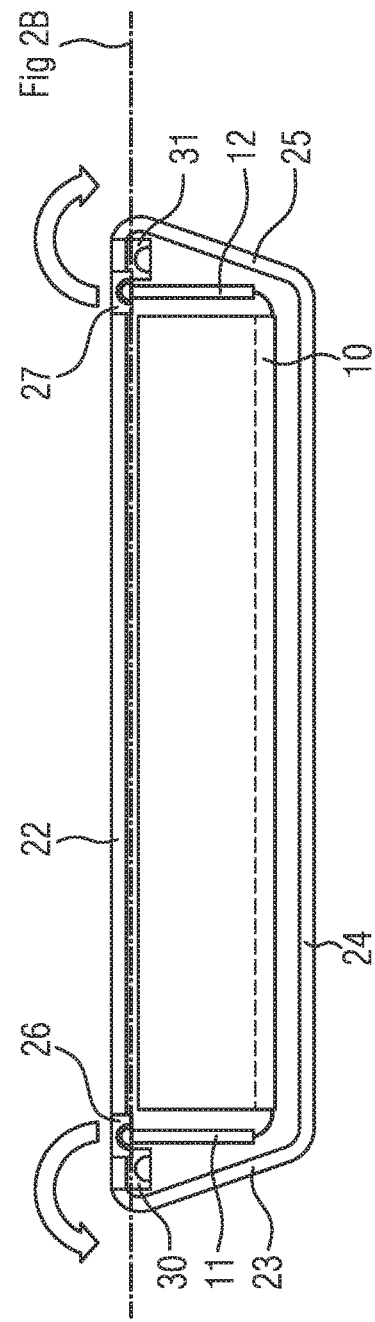
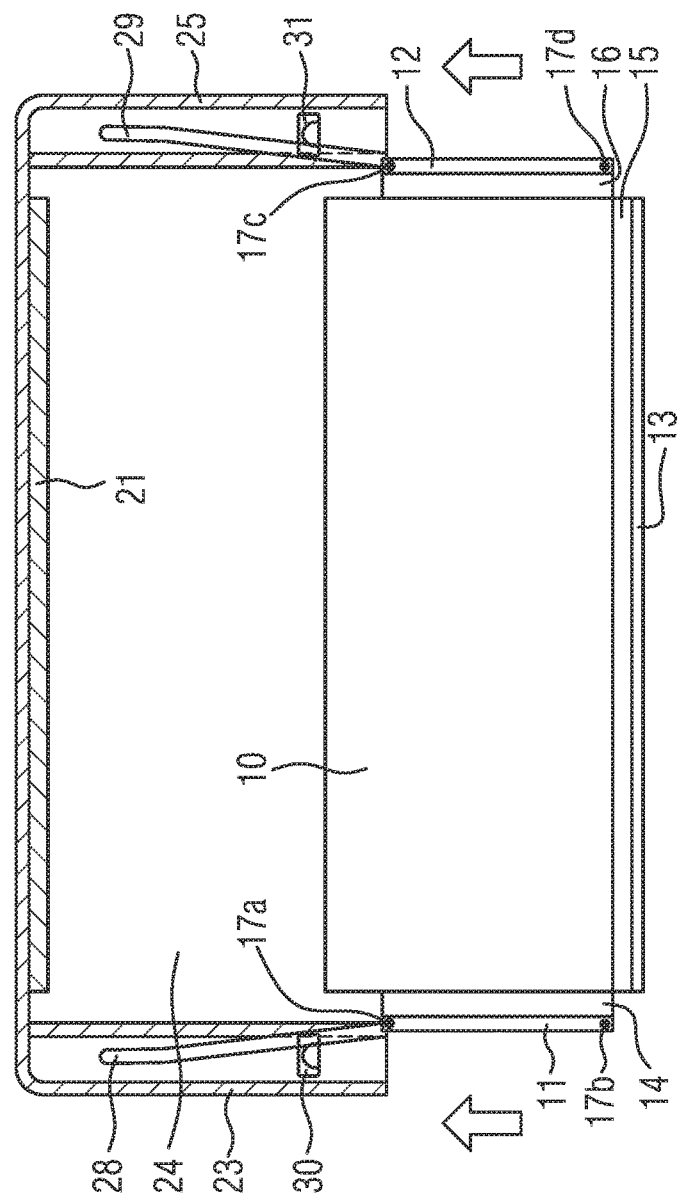

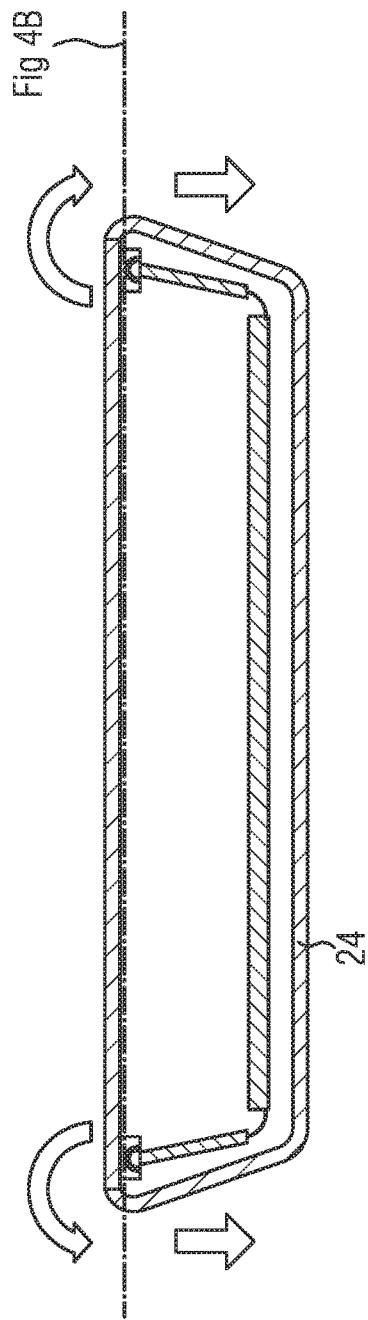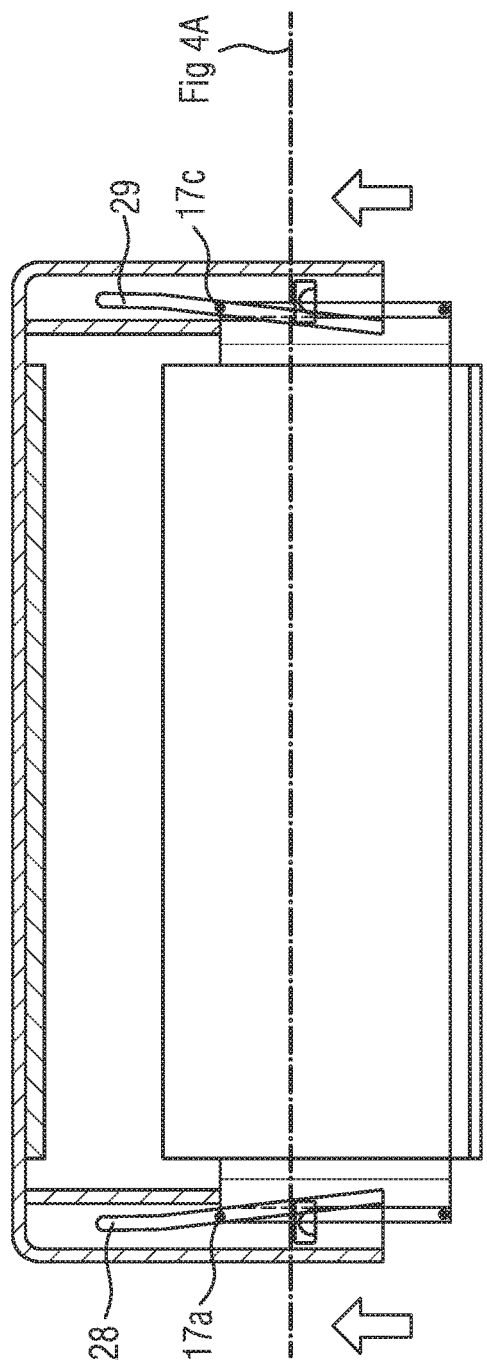
FIG 4A
FIG 4B

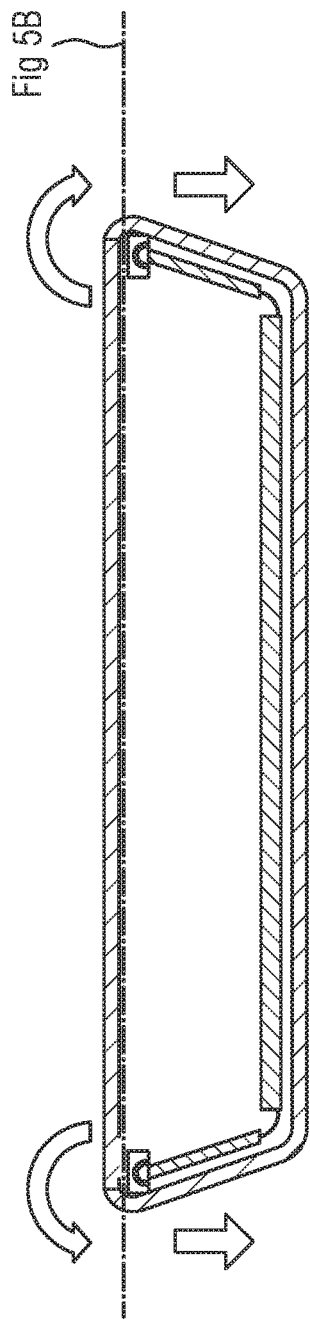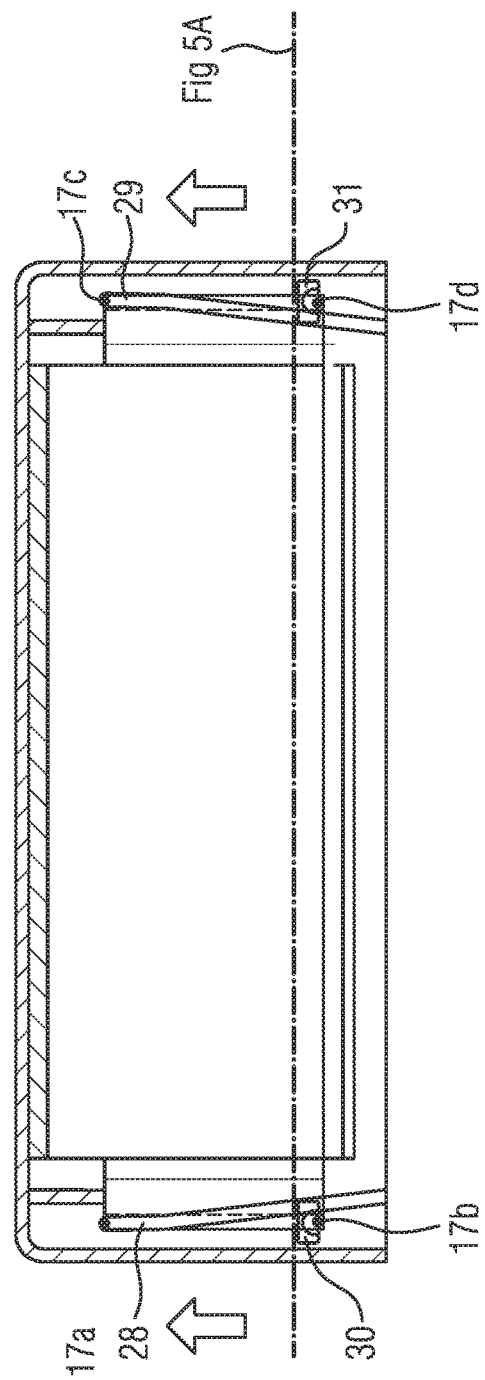
FIG. 5A
FIG. 5B

HOUSING FOR ACCOMMODATING A SINGLE- OR MULTI-PART PRINTED CIRCUIT BOARD

BACKGROUND OF THE INVENTION

Field of the Invention

The invention relates to a housing for accommodating a single- or multi-part printed circuit board, with an opening in a first housing side for inserting the printed circuit board, and with at least one guide rail which has a groove for receiving the printed circuit board and is situated on at least one first housing side wall of the group of housing side walls running perpendicularly to the first housing side.

Such a housing is known from DE 10 2004 005 330 A1 and is intended to accommodate a printed circuit board equipped with electronic components which have the task of controlling a motor vehicle function. This may for example be an engine control unit.

Control units in the automotive field are subjected to high mechanical loads, in particular vibrations, so it is necessary to properly anchor the individual printed circuit board parts to the housing. This is achieved usually by means of screws, which however entails an increased production complexity, but according to DE 10 2004 005 330 A1 may also be implemented using a guide rail with a clamping function.

Moreover, on account of power electronics components and the significant heating associated therewith, good heat transfer from a printed circuit board part to the normally metallic housing, which functions as a heatsink, has to be provided. For this, often a thermoconductive material is applied to the printed circuit board and the electronic components and fills the gap between the circuit board and the housing side wall serving as a heatsink. If however a printed circuit board provided with such a thermoconductive material according to DE 10 2004 005 330 A1 is inserted in a housing by means of a guide rail, part of the thermoconductive material at the housing opening edge is scraped away, so that a good heat transfer is no longer possible.

Also, control units for sequence control in vehicles, in particular engine control units, must undertake ever more complex control tasks and therefore have an increasing number of electronic and electrical components that have to be arranged on printed circuit boards. In order to meet this requirement, in addition to the use of a plurality of printed circuit boards that then have to be electrically connected to one another in a complex manner, there are multi-part printed circuit boards which are connected together by means of current-carrying, flexible regions, produced for example by milling the corresponding printed circuit board regions. This means sim-plification of the production process, since particularly the subsequent electrical connection of a plurality of printed circuit boards no longer applies.

In these multi-part printed circuit boards too, good cooling of the components must be ensured. Also, a good mechanical connection of the circuit board parts to the housing is required since multi-part circuit boards are particularly susceptible to faults under vibration, because of the flexible connections of the individual circuit board parts.

SUMMARY OF THE INVENTION

It is therefore the object of the invention to specify a housing which meets these requirements both for a single-part printed circuit board and also for multi-part printed circuit boards.

The object is achieved by a housing for accommodating a single- or multi-part printed circuit board, with an opening in a first housing side for inserting the printed circuit board, with at least one guide rail which has a groove for receiving the printed circuit board and is situated on at least one first housing side wall of the group of housing side walls running perpendicularly to the first housing side, wherein the at least one guide rail is designed to receive a peg arranged on one of the printed circuit board parts, and wherein the at least one guide rail runs from the first housing side towards a second housing side opposite the first housing side, in such a manner that the end of the guide rail near the first housing side is further away than the other end of the guide rail from the housing side wall which is oriented perpendicularly to the first housing side wall and is closest to the guide rail.

In this way, advantageously, it is possible to insert a printed circuit board provided with thermoconductive material into the housing initially with a sufficient distance of the printed circuit board from a housing side wall, and because it is guided by the guide rail running towards the housing side wall, the thermoconductive material on the printed circuit board only comes into contact with the housing side wall when the printed circuit board is already almost fully introduced into the housing. Thus the thermoconductive material remains on the printed circuit board and finally fills the gap between the printed circuit board and the housing side wall as required. Because of the use of the at least one peg on the printed circuit board according to the invention, said printed circuit board remains straight although the guide rail has a curved course.

In an advantageous refinement of the housing according to the invention, two guide rails are arranged on the first housing side wall or on the first and a second housing side wall.

In the case of a single-part printed circuit board, the two guide rails are arranged on the first and a second housing side wall suitably lying opposite the first, so that the printed circuit board is properly guided by the grooves in these two guide rails in the housing on insertion.

In the case of a multi-part, in particular a three-part printed circuit board, the two guide rails are advantageously both arranged on the first housing side wall, wherein the two outer circuit board parts are introduced into the housing at an angle, so that the pegs arranged on their outer ends are guided in the grooves of the guide rails. In this way, on insertion of the printed circuit board in the housing, the two outer circuit board parts are folded against their respective assigned housing side wall because of the course of the guide rails.

In a further refinement of the housing according to the invention, a peg receiver for fixing a further peg of a printed circuit board arranged in the housing is arranged on one housing side wall.

Because of the peg receiver, a printed circuit board or a circuit board part may be fixed at two points so that in the fully inserted state, this can be fixedly latched in the housing.

In an advantageous refinement, a peg receiver has the same distance from the housing side wall oriented perpendicularly to the first housing side wall and closest to the guide rail, as the end of an assigned guide rail which is nearer to the second housing side.

Thus a printed circuit board or a circuit board part may be fixed parallel to the housing side wall by means of the guide rail and the peg receiver.

In an embodiment which is advantageous for multi-part printed circuit boards, the distance of a groove of each guide rail from the first housing side wall increases from the first housing side to the second housing side.

In this way, not only the outer circuit board parts but also the middle circuit board part are moved towards the nearest housing side wall on insertion of the printed circuit board in the housing, so that a thermoconductive material makes good contact with the housing side walls. This is achieved solely by the shape and course of the guide rails or grooves formed therein, which advantageously may be formed integrally with the housing.

In mounted state therefore, in an advantageous embodiment, this gives a housing with one or more of the above-mentioned features with a printed circuit board formed from at least three circuit board parts, in which the circuit board parts are connected together by means of a flexible region and arranged at an angle to each other, wherein two outer circuit board parts are arranged to the left and right of the middle circuit board part, and each outer circuit board part is provided with at least one peg on its outer edge.

BRIEF DESCRIPTION OF THE SEVERAL VIEWS OF THE DRAWING

The invention is intended to be described in more detail below with reference to an exemplary embodiment with the aid of figures. In the drawing:

FIG. 2A shows a front view of a sectional plane of a housing according to the invention with a multi-part printed circuit board in a first insertion position, FIG. 2B shows a top view of a sectional plane of a housing according to the invention with a multi-part printed circuit board in the first insertion position, FIG. 4A shows a front view of a respective sectional plane of a housing according to the invention with a multi-part printed circuit board in a third insertion position, FIG. 4B shows a top view of a respective sectional plane of a housing according to the invention with a multi-part printed circuit board in the third insertion position, FIG. 5A shows a front view of a respective sectional plane of a housing according to the invention with a multi-part printed circuit board in the fully inserted and fixed position, and FIG. 5B shows a top view of a respective sectional plane of a housing according to the invention with a multi-part printed circuit board in the fully inserted and fixed position.

DESCRIPTION OF THE INVENTION

Figure 1:
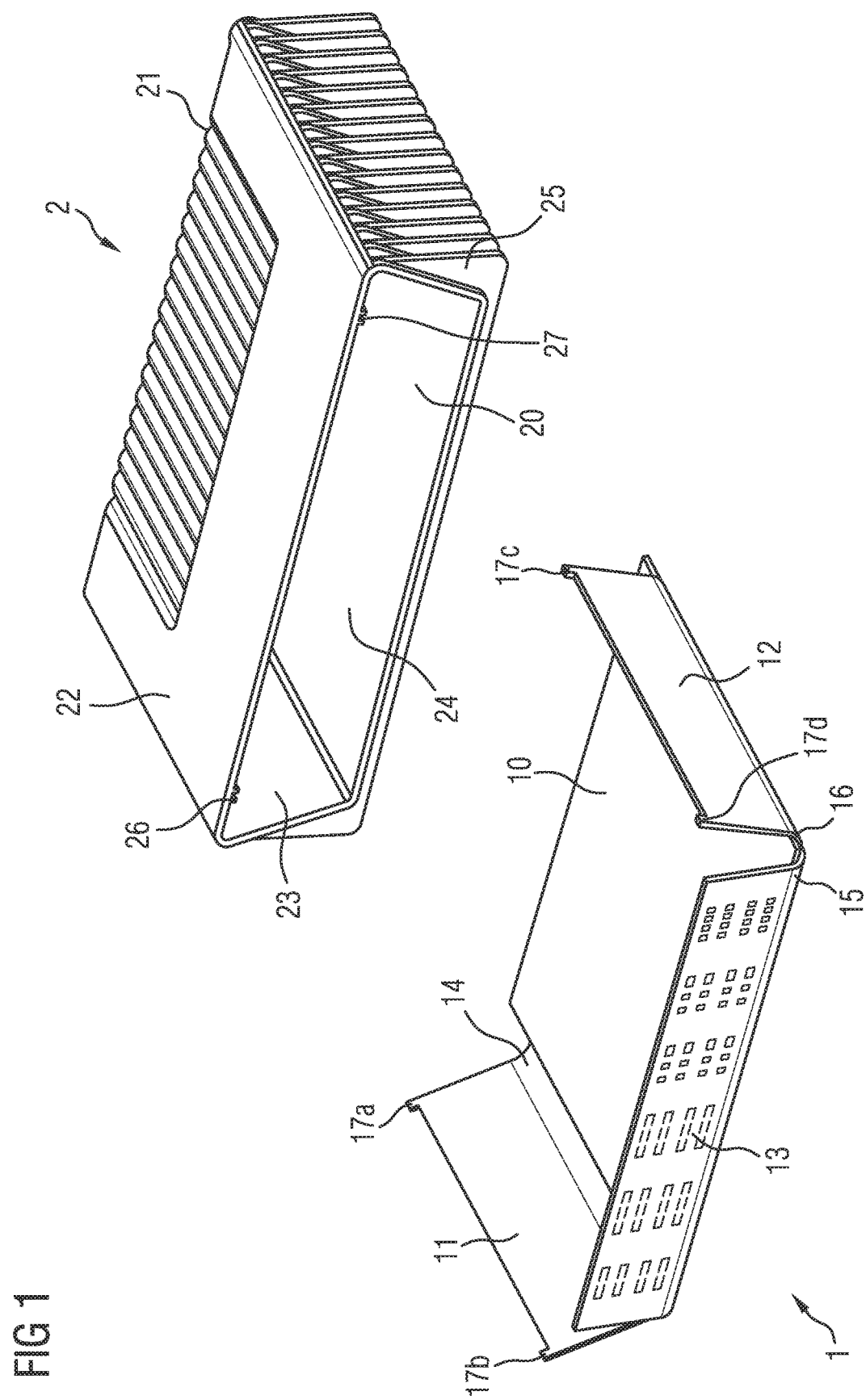
FIG. 1 shows a multi-part printed circuit board and a housing for accommodating the printed circuit board with guide rails according to the invention.

FIG. 1 shows a printed circuit board 1 which consists of four circuit board parts 10, 11, 12, 13, wherein a bottom circuit board part 10 is connected to a first side circuit board part 11 via a first flexible region 14, and to a second side circuit board part 12 via a second flexible region 16. The bottom circuit board part 10 is also connected via a third flexible region 15 to a third side circuit board part 13, which advantageously may serve for connection to one or more connector parts.

The side circuit board parts 11, 12, 13 are angled relative to the bottom circuit board part 10, and are accommodated in a housing 2 as a physical printed circuit board 1.

The housing 2 has a first housing side 20 which is open, and a second housing side 21 opposite this which forms the back of the housing 2. There are also four housing side walls 22, 23, 24, 25 which run perpendicularly to the first housing side 20. Two guide rails 26, 27 are arranged on the first housing side wall 22 and have grooves in which pegs 17a, 17c of the printed circuit board 1 are guided.

As already evident from FIG. 1, on insertion of the printed circuit board 1 in the housing 2, the two circuit board parts 11 and 12 are initially spaced from the two housing side walls 23 and 25; because of the course of the guide rails 26 and 27 described in relation to FIGS. 2A to 5B, they are however increasingly pivoted towards the side walls 23 and 25 as the printed circuit board 1 is inserted in the housing 2.

FIGS. 2A to 5B show various insertion positions of the printed circuit board 1 in the housing 2, wherein the same parts carry the same reference signs in all figures and are not therefore repeated in all figures.

In FIG. 2A, the housing 2 is shown in a top view onto the first housing side, wherein the printed circuit board 1 is positioned in front of the housing 2 according to FIG. 2B. The side circuit board parts 11 and 12 are pivoted through around 90° relative to the bottom circuit board part 10, and their pegs 17a and 17c lie on the grooves of the guide rails 26 and 27 respectively. Also, peg receivers 30 and 31 may be seen, which are arranged in the same fashion as the guide rails 26 and 27 on a first housing side part 22. In the final position of the printed circuit board 1 in the housing 2, the further pegs 17b and 17d come to lie in these peg receivers 30, 31.

FIG. 2B shows a section through the housing 2, as indicated in FIG. 2A, extending through the guide rails 26 and 27 and showing the grooves 28 and 29. Starting from their end closest to the first housing side 20, these run in the direction towards the second housing side 21, and in so doing move ever closer to the respective adjacent housing side walls 23 or 25, so that as the printed circuit board 1 is pushed further into the housing 2, the pegs 17a or 17c in the grooves 28 or 29 of the guide rails 26 or 27 are pivoted outward towards the housing side walls 23 or 25. The movement of the circuit board parts 11 and 12 is indicated in FIG. 2A by semicircular arrows, while the movement of the printed circuit board 1 into the housing 2 is indicated in FIG. 2B by corresponding directional arrows.

Figure 3A:
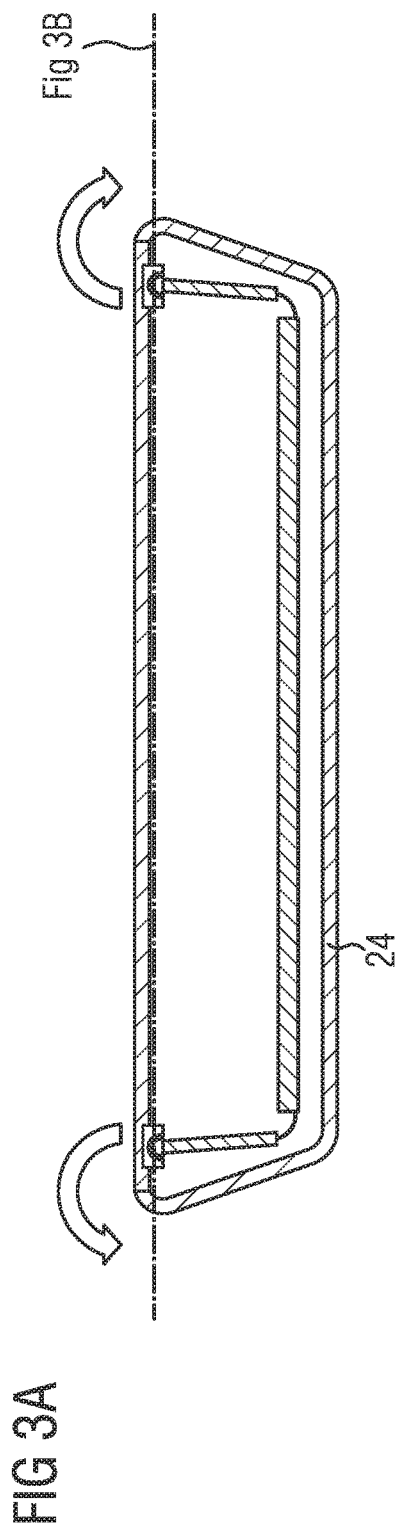
FIG. 3A shows a front view of a respective sectional plane of a housing according to the invention with a multi-part printed circuit board in a second insertion position.
Figure 3B:
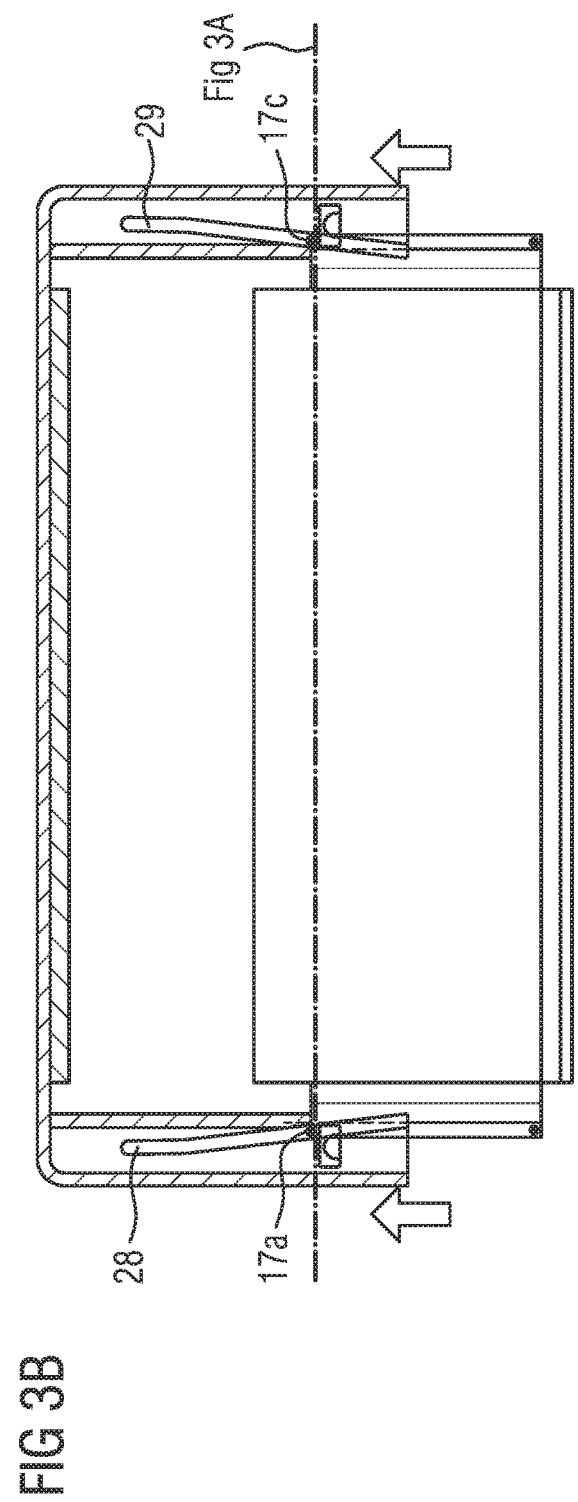
FIG. 3B shows a top view of a respective sectional plane of a housing according to the invention with a multi-part printed circuit board in the second insertion position.

FIGS. 3A and 3B, and 4A and 4B, now show two further positions, wherein it is evident from the respective FIGS. 3B and 4B how far the printed circuit board 1 has already been inserted in the housing 2, while FIGS. 3A and 4A show how the circuit board parts 11 and 12 pivot towards the housing side walls 23 and 25.

The distance of the grooves 28 and 29 from the first housing side wall 22 increases with the increasing distance from the first housing side 20, so that the printed circuit board 1 is moved ever closer towards the housing side wall 24, the further the printed circuit board 1 is inserted in the housing 2. This is indicated by directional arrows in FIG. 4A. In this way, not only the side circuit board parts 11 and 12, but also the bottom circuit board part 10 are moved towards the respective assigned housing side walls 23 and 25 or 24, so that thermoconductive material arranged on the outsides of the printed circuit board finally, in the end position of FIGS. 5A and 5B, comes into contact with the housing side walls 23 and 25 or 24.

Finally, FIGS. 5A and 5B show that when the pegs 17a and 17c reach the end positions in the grooves 28 and 29, the front pegs 17b and 17d are also engaged in the peg receivers 30 and 31, so that the circuit board side parts 11 and 12 are fixed in their position relative to the housing side walls 23 and 25.

The invention claimed is:

1. A housing for accommodating a single-part or multi-part printed circuit board, the housing comprising:
- a first housing side having an opening for inserting the printed circuit board;
- a second housing side opposite said first housing side;
- a group of housing side walls including a first housing side wall oriented perpendicularly to said first housing side and a second housing side wall oriented perpendicularly to said first housing side wall;
- a first guide rail and a second guide rail, both of said first guide rail and said second guide rail disposed on said first housing side wall and extending from said first housing side towards said second housing side, each of said first and second guide rails having one end closest to said first housing side, and a further end farthest from said first housing side, and each of said first and second guide rails having a groove for receiving a peg disposed on a part of the printed circuit board; and
- said one end of said first guide rail being further away from said second side wall than said further end of said first guide rail.

2. The housing according to claim 1, which further comprises a peg receiver associated with said first guide rail and disposed on one of said housing side walls for fixing a further peg of the printed circuit board disposed in the housing.

3. The housing according to claim 2, wherein said further end of said first guide rail and said peg receiver are disposed at an identical distance from said second housing side wall.

4. The housing according to claim 1, wherein said groove of said first guide rail is disposed at a distance from said first housing side wall increasing from said first housing side to said second housing side.

5. A housing for accommodating a single-part or multi-part printed circuit board, the housing comprising:
- a first housing side having an opening for inserting the printed circuit board;
- a second housing side opposite said first housing side;
- a group of housing side walls including a first housing side wall oriented perpendicularly to said first housing side and second housing side walls oriented perpendicularly to said first housing side wall;
- a guide rail disposed on said first housing side wall and extending from said first housing side towards said second housing side, said guide rail having one end closest to and a further end farthest from said first housing side, and said guide rail having a groove for receiving a peg disposed on a part of the printed circuit board; and
- said one end of said guide rail being further away than said further end of said guide rail from one of said second housing side walls being closest to said guide rail; and
- wherein said housing sides and said housing side walls are configured to receive a printed circuit board formed from at least three circuit board parts being connected together by a flexible region and being disposed at an angle relative to each other, the circuit board parts including a middle circuit board part and two outer circuit board parts disposed left and right of the middle circuit board part, and the outer circuit board parts each being provided with an outer edge having at least one peg.

6. A housing for accommodating a single-part or multi-part printed circuit board, the housing comprising:
- a first housing side having an opening for inserting the printed circuit board;
- a second housing side opposite said first housing side;
- a group of housing side walls including a first housing side wall oriented perpendicularly to said first housing side and a second housing side wall oriented perpendicularly to said first housing side wall;
- a first guide rail and a second guide rail, at least one of said first guide rail and said second guide rail disposed on said first housing side wall and extending from said first housing side towards said second housing side, each of said first and second guide rails having one end closest to said first housing side, and a further end farthest from said first housing side, and each of said first and second guide rails having a groove for receiving a peg disposed on a part of the printed circuit board; and
- a distance between said one end of said first guide rail and said one end of said second guide rail being less than a distance between said further end of said first guide rail and said further end of said second guide rail.

* * * * *